(12) United States Patent
Kim

(10) Patent No.: US 7,999,590 B2
(45) Date of Patent: Aug. 16, 2011

(54) LEVEL-CONVERTING FLIP-FLOP AND PULSE GENERATOR FOR CLUSTERED VOLTAGE SCALING

(75) Inventor: Min-su Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/591,668

(22) Filed: Nov. 27, 2009

(65) Prior Publication Data

US 2010/0073028 A1    Mar. 25, 2010

Related U.S. Application Data

(62) Division of application No. 11/706,318, filed on Feb. 15, 2007, now abandoned.

(30) Foreign Application Priority Data

Feb. 15, 2006    (KR) .................. 10-2006-0014740

(51) Int. Cl.
    *H03K 3/00* (2006.01)
(52) U.S. Cl. ........................................ 327/218; 327/212
(58) Field of Classification Search ........... 327/199–225
    See application file for complete search history.

(56) References Cited

U.S. PATENT DOCUMENTS

| | | | |
|---|---|---|---|
| 5,696,994 A * | 12/1997 | Pang | 710/64 |
| 7,132,856 B2 | 11/2006 | Hsu et al. | |
| 7,231,566 B2 * | 6/2007 | Whetsel | 714/726 |
| 7,236,036 B2 * | 6/2007 | Branch et al. | 327/291 |
| 2006/0164147 A1 * | 7/2006 | Nomura | 327/333 |
| 2006/0244503 A1 | 11/2006 | Lee | |

FOREIGN PATENT DOCUMENTS

| | | |
|---|---|---|
| JP | 11-136098 | 5/1999 |
| KR | 1999-005459 | 1/1999 |
| KR | 10-2000-0035255 | 6/2000 |
| KR | 10-2004-0039581 | 5/2004 |

* cited by examiner

*Primary Examiner* — Lincoln Donovan
*Assistant Examiner* — Daniel Rojas
(74) *Attorney, Agent, or Firm* — Harness, Dickey & Pierce, P.L.C.

(57) ABSTRACT

Provided is a level converting flip-flop for clustered voltage scaling and a level-converting pulse generator for use in the flip-flop. The flip-flop may include a pulse generator that receives an input clock signal with a high level equal to a first level and generates a pulse signal with a high level that may be converted into a second level higher than the first level. The flip-flop may further include a latch that latches input data with a high level equal to a third level lower than the second level and outputs output data with a high level that may be converted into the second level in response to the pulse signal. The third level may be equal to the first level. A supply voltage of the second level may be used as a supply voltage to the latch. Both the pulse generator and the flip-flop may have a level converting function without additional circuits, and therefore, the operating speeds of the pulse generator and the flip-flop may be increased without increasing the area and power consumption of the system.

7 Claims, 3 Drawing Sheets

LEVEL-CONVERTING FLIP-FLOP AND PULSE GENERATOR FOR CLUSTERED VOLTAGE SCALING

PRIORITY STATEMENT

This application is a divisional of U.S. patent application Ser. No. 11/706,318, filed Feb. 15, 2007, now abandoned which claims benefit of priority under 35 USC §119 to Korean Patent Application No. 2006-0014740, filed on Feb. 15, 2006, in the Korean Intellectual Property Office (KIPO), the entire contents of which are herein incorporated by reference.

BACKGROUND

1. Field

Example embodiments relate to a level-converting flip-flop and a pulse generator for clustered voltage scaling.

2. Description of the Related Art

Mobile systems that may operate for a longer period of time with limited battery capacity have been increasingly developed over time. Thus, the need for semiconductor devices that operate at a lower voltage for use in mobile systems has increased.

As such, various techniques have been introduced to reduce power consumption of semiconductor devices. One such technique is clustered voltage scaling. In clustered voltage scaling, a higher voltage may be applied to a critical path to increase the speed and a lower voltage may be applied to a non-critical path to reduce power consumption.

In clustered voltage scaling, level converters may be needed between a region in which a higher voltage is applied and a region in which a lower voltage is applied as an interface between the regions. However, the more level converters used, the greater the power consumption may be. In order to reduce the number of level converters needed, a level converter may be located in an output terminal of each flip-flop (which may be most frequently used in a semiconductor integrated circuit). Also, in order to reduce or minimize power consumption caused by clock signals, it may be necessary for all flip-flops to operate at a lower supply voltage. As such, the operating speeds of the flip-flops may be reduced.

If the flip-flops operate at a higher supply voltage, a higher number of level converters may be needed between a clock path and the flip-flops to reduce or prevent a reduction in the operating speed. This may cause overhead due to an increase in the area and power consumption of the system. Also, level converters may be needed in output terminals of the flip-flops, which may increase the area and power consumption of the system.

SUMMARY

Example embodiments provide a flip-flop having both the function of a level converter located in an output terminal of the flip-flop and the function of a level converter located in a clock input terminal, thereby increasing the operating speed of the flip-flop without increasing the area and power consumption of the flip-flop. Example embodiments also provide a level converting pulse generator for use in the flip-flop.

According to example embodiments, there is provided a flip-flop comprising a pulse generator receiving an input clock signal with a high level equal to a first level and generating a pulse signal with a high level that may be converted into a second level higher than the first level, and a latch latching input data with a high level equal to a third level lower than the second level and outputting output data with a high level that may be converted into the second level in response to the pulse signal.

The pulse generator may further receive an enable signal with a high level equal to a fourth level lower than the second level. The pulse generator may be enabled in response to the enable signal.

The third and fourth levels may be equal to the first level. A supply voltage having the second level may be used as a supply voltage to the latch.

According to example embodiments, a pulse generator may include an inversion delayer receiving an input clock signal with a high level equal to a first level and outputting a delayed, inverted input clock signal, a NAND gate performing a NAND operation on the input clock signal and the delayed, inverted input signal and outputting the result, and an inverter inverting a signal received from the NAND gate and outputting a pulse signal.

A first supply voltage having the first level may be used as a supply voltage to the inversion delayer. A second supply voltage having a second level higher than the first level may be used as a supply voltage to the NAND gate and the inverter. Also, pulse generation and level conversion may be performed simultaneously.

The NAND gate may further receive an enable signal with a high level equal to a third level lower than the second level. The third level may be equal to the first level.

According to example embodiments, a pulse generator may comprise a NAND gate performing a NAND operation on a feedback signal and an input clock signal with a high level equal to a first level and outputting the operation result, and an inverter inverting a signal received from the NAND gate and outputting a pulse signal. The pulse generator may further comprise a PMOS transistor and an NMOS transistor being connected in series between a first supply voltage having the first level and a ground voltage, in which the input clock signal and the pulse signal may be supplied to gates of the PMOS transistor and the NMOS transistor, respectively, and a zero keeper storing the feedback signal which may be output at a point that connects the PMOS transistor and the NMOS transistor and may be at a logic low level.

A second supply voltage having a second level higher than the first level may be used as a supply voltage to the NAND gate and the inverter. Also, pulse generation and level conversion may be simultaneously performed.

The NAND gate may further include an enable signal with a high level equal to a third level lower than the second level. The third level may be equal to the first level.

BRIEF DESCRIPTION OF THE DRAWINGS

Example embodiments will be more clearly understood from the following detailed description taken in conjunction with the accompanying drawings.

FIG. 1 is a block diagram of a flip-flop according to example embodiments;

FIG. 2 is a circuit diagram of a level-converting pulse generator illustrated in FIG. 1 according to example embodiments;

FIG. 3 is a circuit diagram of a level-converting pulse generator illustrated in FIG. 1 according to example embodiments;

FIG. 4 is a circuit diagram of a level-converting pulse generator illustrated in FIG. 1 according to example embodiments;

FIG. 5 is a circuit diagram of a level-converting pulse generator illustrated in FIG. 1 according to example embodiments; and FIG. 6 is a circuit diagram of a latch illustrated in FIG. 1 according to example embodiments.

DETAILED DESCRIPTION OF EXAMPLE EMBODIMENTS

Figure 1:
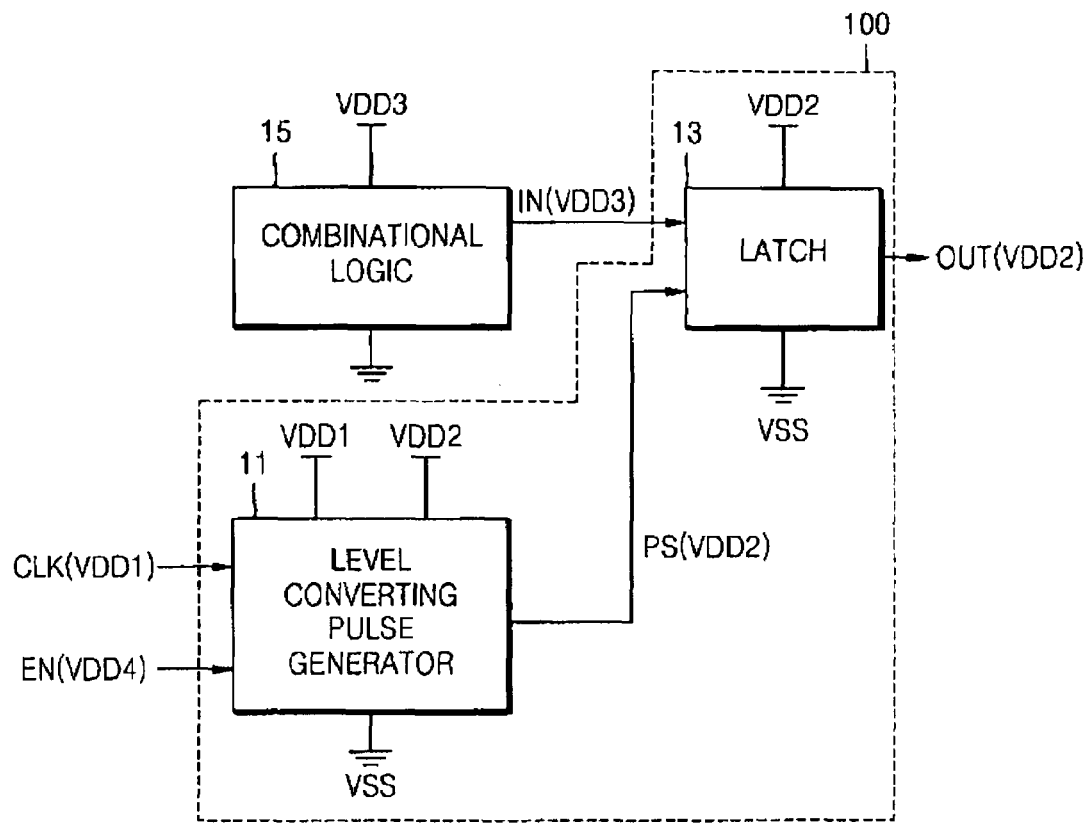
FIGS. 1-6 represent non-limiting, example embodiments as described herein.

Reference will now be made in detail to example embodiments, examples of which are illustrated in the accompanying drawings. However, example embodiments are not limited to the embodiments illustrated hereinafter, and the embodiments herein are rather introduced to provide easy and complete understanding of the scope and spirit of example embodiments. In the drawings, the thicknesses of layers and regions are exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may, typically, may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram of a flip-flop 100 according to example embodiments. For ease of description, a combinational logic circuit 15 that supplies input data IN to the flip-flop 100 is also illustrated in FIG. 1.

Referring to FIG. 1, the flip-flop 100 may include a pulse generator 11 and a latch 13. The pulse generator 11 may have a level converting function and may receive an input clock signal CLK with a high level equal to a first level VDD1 to generate a pulse signal PS with a high level equal to a second level VDD2 higher than the first level VDD1. Alternatively, an enable signal EN with a high level equal to a fourth level VDD4 lower than the second level VDD2 may be supplied to the pulse generator. The pulse generator 11 may be enabled by the enable signal EN.

In response to the pulse signal PS, the latch 13 latches input data IN with a high level equal to a third level VDD3 lower than the second level VDD2, and outputs output data OUT with a high level that may be converted into the second level VDD2.

The combinational logic circuit 15 supplies the input data IN to the flip-flop 100. The combinational logic circuit 15 may be located between two flip-flops.

As described above, the flip-flop 100 may use a maximum of four supply voltages VDD1 through VDD4. Unless specific conditions are given, the first through fourth levels, VDD1 through VDD4, may be different from one another. In general, the supply voltage VDD2 may be the highest supply voltage, and the other supply voltages, VDD1, VDD3, and VDD4, may be lower than the supply voltage VDD2. The supply voltages VDD1, VDD3, and VDD4 may be the same.

A cross-coupled logic circuit may be used for conventional level converting, but example embodiments use pulse signals for level converting. In general, when a logic circuit gate that uses a specific supply voltage is driven by an input signal having a level lower than the specific supply voltage, a PMOS transistor of the logic circuit gate may not be completely turned off, and thus, may cause short circuit current.

According to example embodiments, the flip-flop 100 may convert the input data IN of a low level (the supply voltage VDD3) into the output data OUT of a high level (the supply voltage VDD2) only for a pulse duration by using the pulse signal PS generated by the pulse generator 11. Thus, even if a short circuit current may occur, the short circuit current may flow through the flip-flop 100 in a limited pulse duration.

Because the flip-flop 100 uses pulse signals for level converting, a level converting function may be included into the flip-flop 100 without additional logic circuit. In general, a high level of the clock signal CLK may be converted into a low level (the supply voltage VDD1) to reduce power consumption due to the clock signal CLK. As such, when the flip-flop 100 uses a high supply voltage (the supply voltage VDD2), a level converter may be required between the clock signal CLK and the flip-flop 100.

Therefore, in the flip-flop 100, the pulse generator 11 may have the level converting function, and the latch 13 may latch the input data IN of a low level (the supply voltage VDD3) by using the pulse signal PS generated by the pulse generator 11 and may output the output data OUT of a high level (the supply voltage VDD2).

Figure 2:
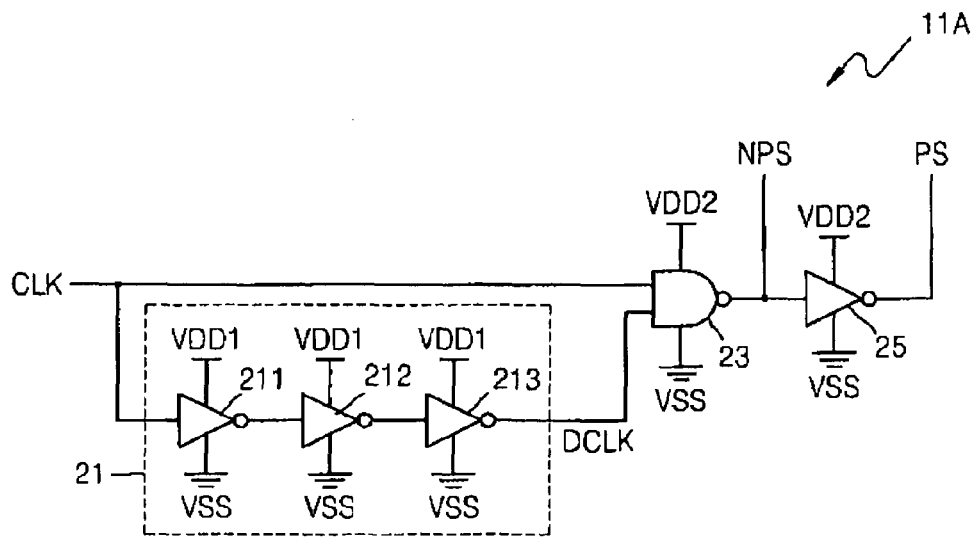

FIG. 2 is a circuit diagram of a level-converting pulse generator 11A illustrated in FIG. 1 according to example embodiments. Referring to FIG. 2, the level-converting pulse generator 11A may include an inversion delayer 21 that receives an input clock signal CLK and outputs a delayed, inverted input clock signal DCLK, a NAND gate 23 that performs a NAND operation on the delayed, inverted input clock signal DCLK and outputs a signal NPS (the operation result), and an inverter 25 that inverts the signal NPS received from the NAND gate 23 and outputs a pulse signal PS.

A first supply voltage VDD1 having a first level may be used as a supply voltage to the inversion delayer 21, and a second supply voltage VDD2 having a second level may be used as a supply voltage to the NAND gate 23 and the inverter 25. Accordingly, the supply voltage to the inversion delayer 21 may be different from that applied to the NAND gate 23 and the inverter 25.

Thus, the level-converting pulse generator 11A may simultaneously perform pulse generation and level conversion. The level-converting pulse generator 11A may receive the input clock signal CLK with a high level equal to the supply voltage VDD1 and may generate the pulse signal PS with a high level that may be converted into a supply voltage VDD2 higher than the level VDD1.

Figure 3:
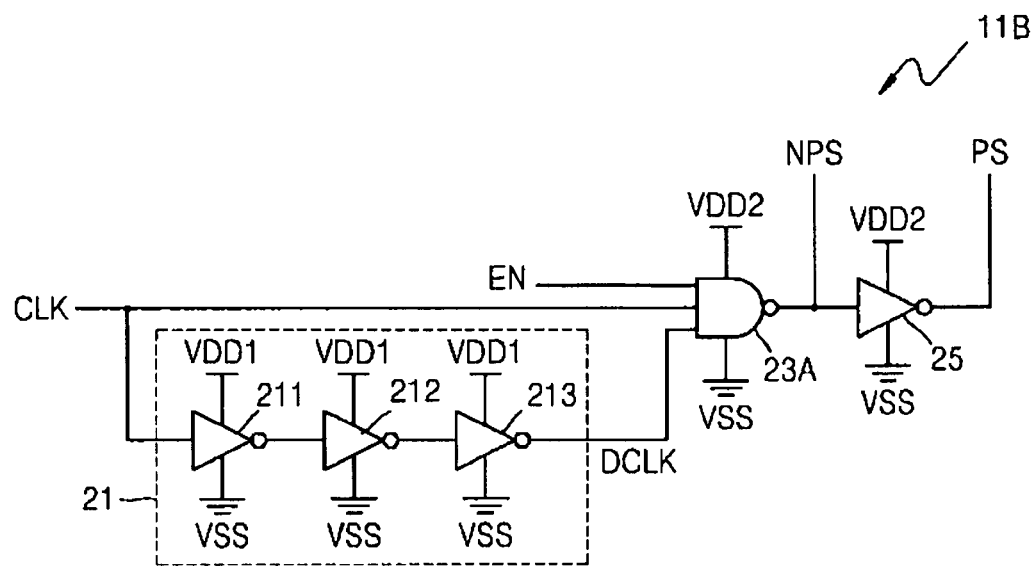

FIG. 3 is a circuit diagram of a level-converting pulse generator 11B illustrated in FIG. 1 according to example embodiments. Referring to FIG. 3, the level-converting pulse generator 11B may be the same as the level-converting pulse generator 11A of FIG. 2 with the exception of an enable signal EN being further supplied to a NAND gate 23A. Therefore, a detailed description of the level-converting pulse generator 11B will be omitted.

A high level of the enable signal EN may be equal to a supply voltage VDD4 lower than the supply voltage VDD2.

Figure 4:
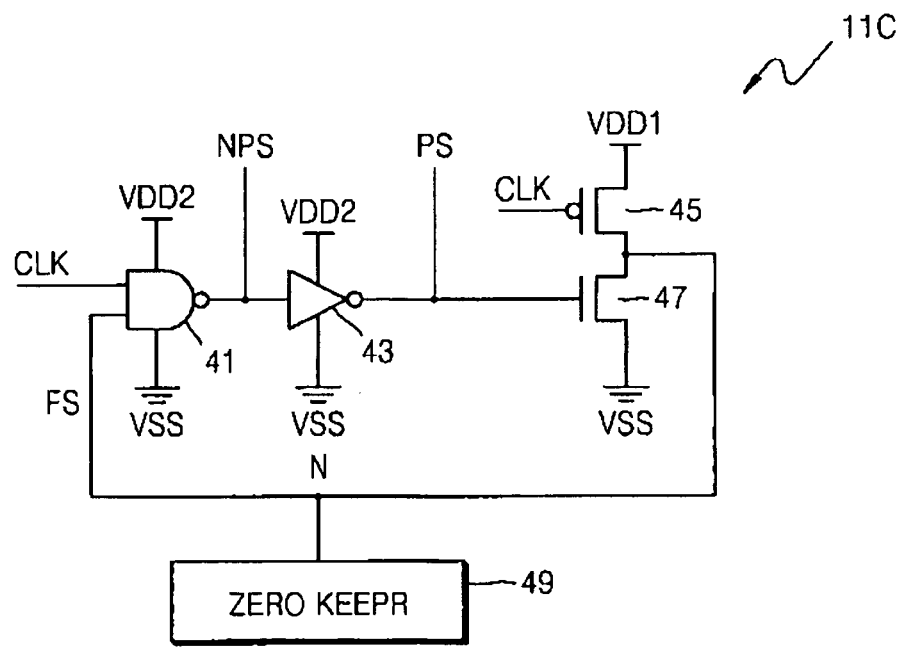

FIG. 4 is a circuit diagram of a level-converting pulse generator 11C illustrated in FIG. 1 according to example embodiments. Referring to FIG. 4, the level-converting pulse generator 11C may include a NAND gate 41 that performs the NAND operation on a feedback signal FS and an input clock signal CLK and outputs a signal NPS and an inverter 43 that inverts the signal NPS received from the NAND gate 41 and outputs a pulse signal PS. The level-converting pulse generator 11c may further include a PMOS transistor 45 and an NMOS transistor 47 connected in series between a first supply voltage VDD1 having a first level and a ground voltage VSS and having the input clock signal CLK and the pulse signal PS applied to gates of the PMOS transistor 45 and the NMOS transistor 47, respectively, and a zero keeper 49 that maintains a feedback signal FS, which may be output at a point that connects the PMOS transistor 45 and the NMOS transistor 47 at a logic low level. The zero keeper 49 may act as a latch.

A second supply voltage VDD2 having a second level higher than the first level (the supply voltage VDD1) may be applied as a supply voltage to the NAND gate 41 and the inverter 43. Thus, the level-converting pulse generator 11C may simultaneously perform pulse generation and level conversion. The level-converting pulse generator 11C may receive the input clock signal CLK having a high level (the supply voltage VDD1) and may generate the pulse signal PS having a level higher than the supply voltage VDD1 (e.g., the supply voltage VDD2).

Figure 5:
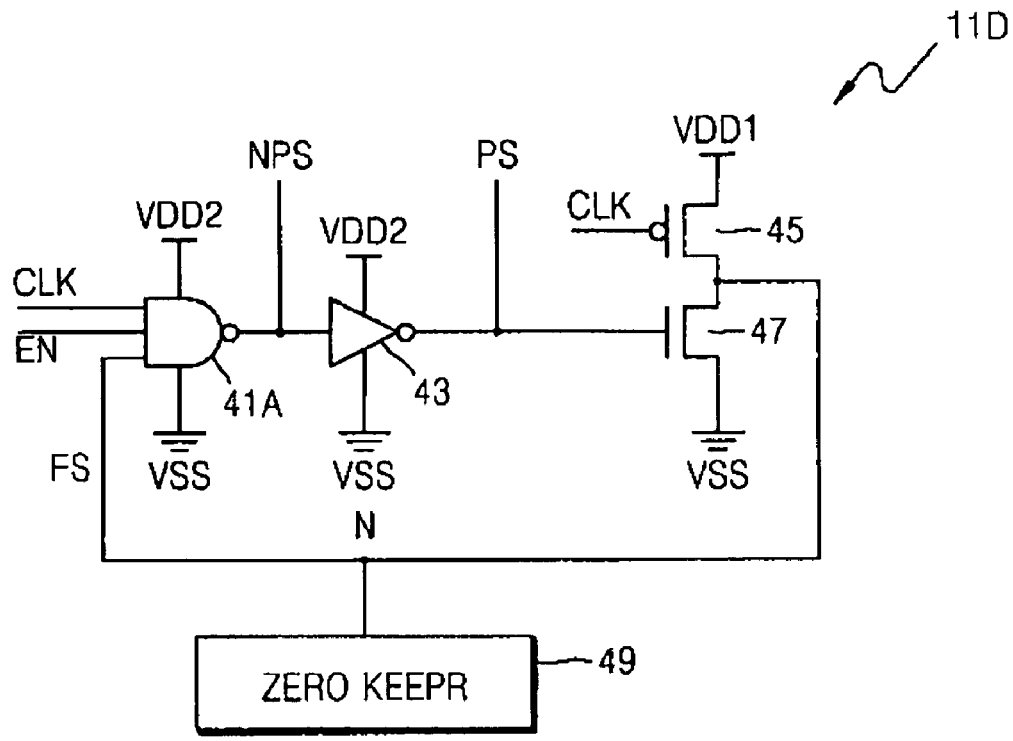

FIG. 5 is a circuit diagram of a level-converting pulse generator 11D illustrated in FIG. 1 according to example embodiments. Referring to FIG. 5, the level-converting pulse generator 11D may be the same as the level-converting pulse generator 11C of FIG. 4 with the exception of an enable signal EN being further supplied to a NAND gate 41A. Thus, a detailed description of the level-converting pulse generator 11D will be omitted.

A high level of the enable signal EN may be equal to a supply voltage VDD4 lower than a supply voltage VDD2.

Figure 6:
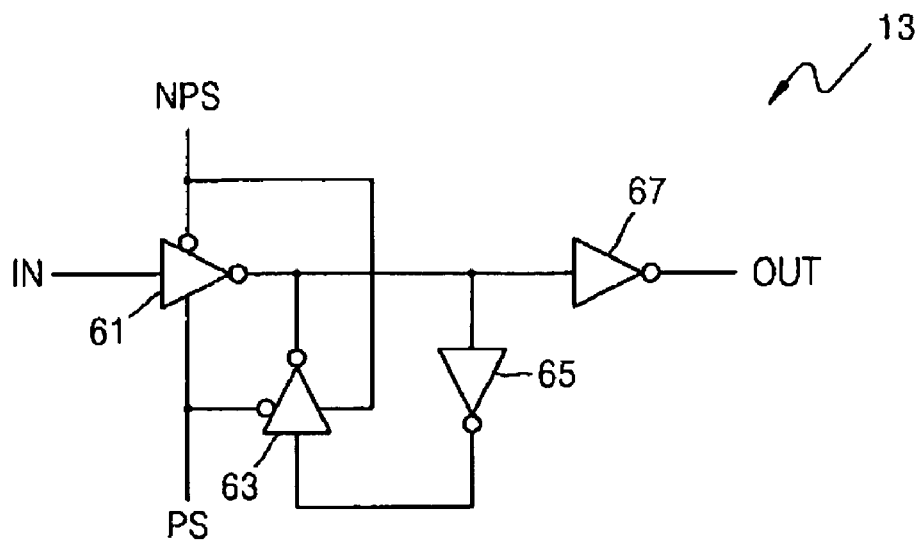

FIG. 6 is a circuit diagram of the latch 13 illustrated in FIG. 1 according to example embodiments. Referring to FIG. 6, the latch 13 may include a controlled inverter 61 that is turned on when a signal NPS is at a logic low level and a pulse signal PS (e.g., an inversion signal of the signal NPS) is at a logic high level, a controlled inverter 63 that is turned on when the signal NPS is at a logic high level and the pulse signal PS is at a logic low level, a first inverter 65, and a second inverter 67.

The supply voltage VDD2 having a second level may be applied as a supply voltage to the latch 13. The latch 13 may latch input data IN with a high level equal to a supply voltage VDD3 lower than the supply voltage VDD2 and may output output data OUT having a high level (the supply voltage VDD2) in response to the pulse signal PS having a high level (the supply voltage VDD2).

The latch 13 may not have a level converting function. However, the latch 13 may perform level converting because the pulse signal PS having a high level (the supply voltage VDD2) may be used as a control signal. The high level of the input data IN may be equal to the supply voltage VDD3 lower than the supply voltage VDD2, and the supply voltage VDD2 may be applied as a supply voltage to the latch 13. The latch 13 may be embodied as various types having the same function.

According to example embodiments described above, it may be possible to include a level converting function into a pulse generator and a flip-flop without additional circuits. As such, the operating speeds of the pulse generator and the flip-flop may be increased without increasing the area and power consumption of the system.

The foregoing is illustrative of example embodiments and is not to be construed as limiting thereof. Although example embodiments have been described, those skilled in the art will readily appreciate that many modifications are possible in example embodiments without materially departing from the novel teachings and advantages of example embodiments. Accordingly, all such modifications are intended to be included within the scope of the claims. In the claims, means-plus-function clauses are intended to cover the structures described herein as performing the recited function, and not only structural equivalents but also equivalent structures. Therefore, it is to be understood that the foregoing is illustrative of example embodiments and is not to be construed as limited to the specific embodiments disclosed, and that modifications to the disclosed embodiments, as well as other embodiments, are intended to be included within the scope of the appended claims. Example embodiments are defined by the following claims, with equivalents of the claims to be included therein.

What is claimed is:

1. A flip-flop comprising:
a pulse generator, the pulse generator including
a receiving portion configured to receive an input clock signal with a high level equal to a first level, and
a generating portion configured to generate a pulse signal with a high level that is converted into a second level higher than the first level; and
a latch configured to latch input data with a high level equal to a third level lower than the second level and output output data with a high level that is converted into the second level in response to the pulse signal,
wherein the receiving portion includes a NAND gate configured to receives the input clock signal and performs a NAND operation on a feedback signal and the input clock signal, and to outputs an operation result, and
the generating portion includes an inverter configured to invert a signal received from the NAND gate and outputs the pulse signal, and includes a PMOS transistor and a NMOS transistor connected in series between a first supply voltage having the first level and a ground voltage, in which the input clock signal and the pulse signal are applied to gates of the PMOS transistor and the NMOS transistor, respectively.

2. The flip-flop of claim 1, wherein the third level is equal to the first level.

3. The flip-flop of claim 1, wherein a supply voltage having the second level is used as a supply voltage to the latch.

4. The pulse generator of claim 1 further comprising:
a zero keeper storing the feedback signal which is output at a point that connects the PMOS transistor and the NMOS transistor and is at a logic low level,
wherein a second supply voltage having the second level is used as a supply voltage to the NAND gate and the inverter.

5. The pulse generator of claim 1, wherein:
the NAND gate receives the input clock signal with a high level equal to the first level; and
pulse generation and level conversion are simultaneously performed.

6. The pulse generator of claim 1, wherein the NAND gate further receives an enable signal with a high level equal to a third level lower than the second level, and performs the NAND operation on the feedback signal, the input clock signal, and the enable signal.

7. The pulse generator of claim 6, wherein the third level is the same as the first level.

* * * * *